(12) United States Patent
Ikeda

(10) Patent No.: US 6,304,498 B1
(45) Date of Patent: Oct. 16, 2001

(54) SEMICONDUCTOR MEMORY DEVICE CAPABLE OF SUPPRESSING DEGRADATION IN OPERATION SPEED AFTER REPLACEMENT WITH REDUNDANT MEMORY CELL

(75) Inventor: Yutaka Ikeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/589,106

(22) Filed: Jun. 8, 2000

(30) Foreign Application Priority Data

Dec. 27, 1999 (JP) ................................. 11-369548

(51) Int. Cl.[7] ..................................... G11C 7/00
(52) U.S. Cl. .............. 365/200; 365/230.06; 365/230.08
(58) Field of Search .................. 365/200, 230.03, 365/230.08, 230.06

(56) References Cited

U.S. PATENT DOCUMENTS 5,519,657 * 5/1996 Armoto ............................. 365/200
5,699,306 * 12/1997 Lee et al. .......................... 365/200
5,835,424 * 11/1998 Kikukawa et al. ................. 365/200
6,064,607 * 5/2000 Miki et al. ......................... 365/200
6,118,710 * 9/2000 Tsuji ................................. 365/200
6,178,122 * 1/2001 Tomishima et al. ............. 365/189.11

FOREIGN PATENT DOCUMENTS 4-291098    10/1992   (JP) .

* cited by examiner

*Primary Examiner*—David Nelms
*Assistant Examiner*—Gene N. Auduong
(74) *Attorney, Agent, or Firm*—McDermott, Will & Emery

(57) ABSTRACT

A row predecoder receives internal address signals output from address latch circuits and outputs the predecode signals. A spare determination circuit receives address signals and outputs a comparison result with a defective row address stored in advance. A normal row decoder receives a predecode address signal and selects a word line within a corresponding normal memory cell block when a redundancy replacement is not performed, while a redundant row decoder receives a predecode signal and selects a redundant word line within a redundant memory cell block when the redundancy replacement is performed.

14 Claims, 14 Drawing Sheets

SEMICONDUCTOR MEMORY DEVICE CAPABLE OF SUPPRESSING DEGRADATION IN OPERATION SPEED AFTER REPLACEMENT WITH REDUNDANT MEMORY CELL

BACKGROUND OF THE INVENTION

1. Field of the Invention

The present invention relates to the arrangement of a semiconductor memory device, a more specifically, to the arrangement of a redundancy determination circuit in a semiconductor memory device.

2. Description of the Background Art

In general, in a semiconductor memory device, a redundant memory cell array is provided in order to repair a defective memory cell within a memory cell array that is produced during the manufacturing process, and the so-called redundancy repair is performed in which the defective memory cell is replaced by a memory cell within the redundant memory cell array.

In this case, a redundancy determination circuit is provided for storing the address information of the memory cell column or the memory cell row in which the defective memory cell resides in advance within the semiconductor memory device by using an element, such as a fuse element, capable storing the information in a non-volatile manner, and for determining whether an address signal provided from the outside matches the defective row address or the defective column address, and when a match occurs, for stopping the selecting operation for a normal memory cell array and instead activating the selecting operation for the redundant memory cell array.

While the demand for a higher operation speed of the semiconductor memory device intensifies, due to such redundancy determination, the access time for the address to which redundancy replacement is performed tends to degrade in general in comparison with the case in which a normal memory cell is selected.

As it is, although the defective memory cell can be repaired by the redundant memory cell array, the requirement specification of a product cannot be satisfied with regard to the operation speed.

A conventional semiconductor memory device and its problems will be described in further detail below.

FIG. 14 is a schematic block diagram related to the description of the circuit arrangement for selecting a memory cell row within a memory cell array in a conventional semiconductor memory device. For simplicity of description, a row address signal provided to row and column address buffer 224 consists of 8 bits of address signals A<0> to A<7>.

For simplicity, a normal memory cell array is provided with 256 word lines WL, and a redundant memory cell array provided corresponding to the normal memory cell array is provided with four redundant memory cell rows to which four redundant word lines SWL are correspondingly arranged.

As shown in FIG. 14, the respective address latch circuits 210.0 to 210.7 correspondingly provided for address signals A<0> to A<7> latch the corresponding address signals when a signal ZRAL is in the active state, and output internal address signals RA<0>, ZRA<0>, RA<1>, ZRA<1>, ... RA<7>, ZRA<7> according to a signal RADE.

For instance, address latch 210.0 receives an address signal A<0> and outputs internal address signals RA<0> and ZRA<0>.

A row predecoder 226 receives internal address signals RA<0>, ZRA<0> to RA<7>, ZRA<7> output from address latch circuits 210.0 to 210.7, and outputs predecode signals XA<0:3>, XB<0:3>, XC<0:3>, and XD<0:3>.

On the other hand, a spare determination circuit 240 receives address signals A<2:7> (=A<2> to A<7>) upon activation of signal ZRAL, and according to signal RADE, outputs a comparison result with a defective row address stored in advance. A logic gate 232 receives a signal RXT and a determination signal output from spare determination circuit 240, and outputs a signal NRE which attains the active state (the logic high or "H" level) when no match is detected between address signals A<0> to A<7> and a redundant memory cell row address as a result of spare determination and which attains the inactive state (the logic low or "L" level) when the match with the redundant memory cell row address is detected.

On the other hand, a logic gate 234 receives signal RXT and an output from spare determination circuit 240, and outputs a signal SRE which attains the active state ("H" level) when a match occurs between a redundant memory cell row and address signals A<0> to A<7> provided from the outside and which attains the inactive state ("L" level) when no match occurs.

A normal row decoder 241 receives predecode address signals XA<0:3> to XD<0:3>, and activates one of word lines WL<0:255> (WL<0> to WL<255>) within a corresponding normal memory cell array when signal NRE is in the active state.

A redundant row decoder 242, on the other hand, receives a predecode signal XA<0:3> and signal SRE, and activates one of redundant word lines SWL<0:3> (SWL<0> to SWL<3>) within a redundant memory cell block RCBi according to the activation of signal SRE when the redundant memory cell row and the address signal provided match in spare determination circuit 240.

FIG. 15 is a schematic block diagram related to the description of the arrangement of spare determination circuit 240 shown in FIG. 14.

Spare determination circuit 240 is provided with a delay circuit 3002 for receiving signal RADE and outputting signal RADE as a signal RADED after the delay of a prescribed period of time, a defective address comparing portion 3010 for storing a defective address row in advance and receiving input predecode signals XB<0>, XB<1>, XC<0> to XC<3>, and XD<0> to XD<3> to output a comparison result, a P-channel MOS transistor TP110 for selectively supplying a power-supply potential Vcc to defective address comparing portion 3010 according to signal RADED, an inverter INV110 for receiving an output from an output node n101 of defective address comparing portion 3010, a P-channel MOS transistor TP111 connected between power-supply potential Vcc and node n101 for receiving an output from inverter INV110 at a gate, and an inverter INV111 for receiving an output from inverter INV110 to output a signal SREF.

Defective address comparing portion 3010 includes a fuse element F3100.0 and an N-channel MOS transistor TN3100.0, a fuse element F3100.1 and an N-channel MOS transistor TN3100.1 to a fuse element F3100.15 and an N-channel MOS transistor TN3100.15, respectively connected in series between node n101 and a ground potential GND.

Gates of transistors TN3100.0 to TN3100.15 respectively receive predecode signals XB<0>, XB<1>, XC<0> to XC<3>, and XD<0> to XD<3>.

FIG. 16 is a timing chart related to the description of an operation of a circuit for selecting a cell row shown in FIG. 14.

When an address signal is provided from the outside, according to the activate state of signal ZRAL at time t0, address latches 210.0 to 210.7 latch in address signals A<0> to A<7>.

Thereafter, according to the activation of signal RADE at time t1, signal ZRAL enters the inactive state at time t2. At time t3 when the time margin including the waiting time for a result of the determination of the redundant row and the delay time required for a predecode operation and the like has elapsed since signal ZRAL entered the inactive state, signal RXT for instructing the start of a selecting operation of a word line is activated.

In other words, such time margin must be allowed from the inactivation of signal ZRAL to the activation of signal RXT so that a row select operation would be delayed for the time required for a redundant row replacement.

SUMMARY OF THE INVENTION

The object of the present invention is to provide a semiconductor memory device capable of suppressing the degradation in the operation speed even when a defective memory cell is replaced by a redundant memory cell within a redundant memory cell array.

In short, the present invention is a semiconductor memory device provided with a memory cell array, an address buffer, a row select circuit, a column select circuit, and a data input/output circuit.

The memory cell array includes a plurality of memory cells arranged in a matrix of rows and columns. The memory cell array includes a normal memory cell array including a plurality of normal memory cells, and a redundant memory cell array including a plurality of redundant memory cells to replace defective memory cells in the normal memory cell array.

The address buffer receives a row address signal and a column address signal provided from outside the semiconductor memory device.

The row select circuit selects a row of the memory cell array according to the row address signal.

The row select circuit includes a row predecoder, a redundancy determination circuit, a normal row decoder, and a redundant row decoder. The row predecoder receives the row address signal from the address buffer and generates a row predecode signal. The redundancy determination circuit holds a defective memory cell address in advance, receives the row address signal from the address buffer, and determines whether to perform the replacement by redundant memory cells. The normal row decoder selects a memory cell row from the normal memory cell array according to the row predecode signal from the row predecoder when no redundancy replacement is performed. The redundant row decoder selects a memory cell row from the redundant memory cell array when a redundancy replacement is performed.

The column select circuit generates a signal for selecting at least one of the columns of the memory cell array according to the column address signal.

The data input/output circuit communicates storage data with the selected memory cell column.

According to another aspect of the present invention, the present semiconductor memory device is provided with a memory cell array, an address buffer, a row select circuit, a column select circuit, and a data input/output circuit.

The memory cell array includes a plurality of memory cells arranged in a matrix of rows and columns. The memory cell array includes a normal memory cell array including a plurality of normal memory cells and a redundant memory cell array including a plurality of redundant memory cells to replace defective memory cells in the normal memory cell array.

The address buffer receives a row address signal and a column address signal provided from outside the semiconductor memory device. The address buffer includes a predecode latch circuit for generating a row predecode signal from the row address signal.

The row select circuit selects a row of the memory cell array according to the row address signal.

The row select circuit includes a redundancy determination circuit, a normal row decoder, and a redundant row decoder. The redundancy determination circuit holds a defective memory cell address in advance, receives the row address signal, and determines whether the replacement by redundant memory cells is to be performed. The normal row decoder selects a memory cell row from the normal memory cell array according to the row predecode signal from the predecode latch circuit when no redundancy replacement is performed. The redundant row decoder selects a memory cell row from the redundant memory cell array when a redundancy replacement is performed.

The column select circuit generates a signal for selecting at least one of the columns of the memory cell array according to the column address signal.

The data input/output circuit communicates storage data with the selected memory cell column.

Another advantage of the present invention is that there is no need to allow room for the predecoding time so that a high-speed operation is possible even when the redundancy replacement function is provided, since the predecoder and the redundancy determination circuit both operate according to the row address signal from the address buffer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
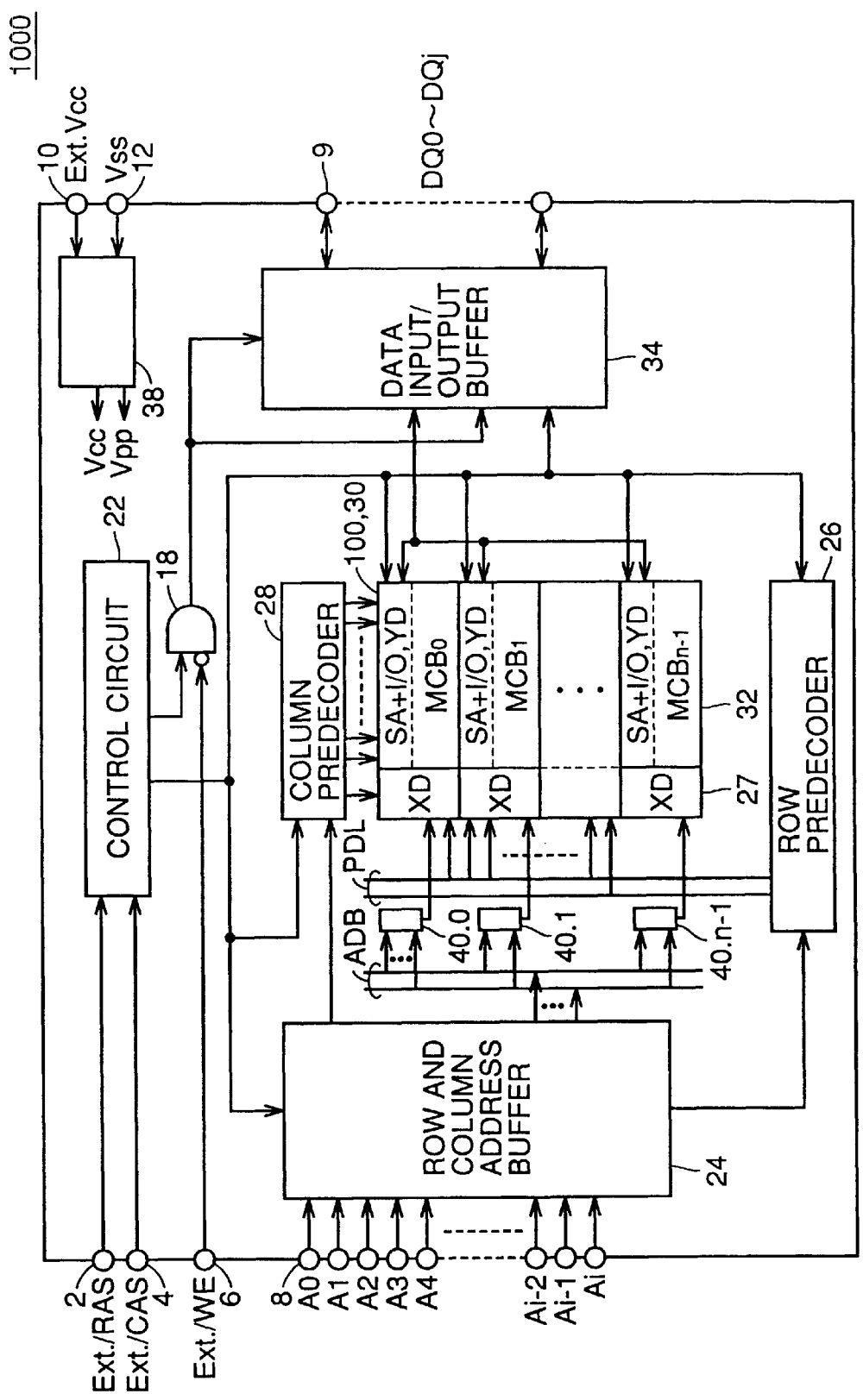
FIG. 1 is a schematic block diagram representing the arrangement of a semiconductor memory device 1000 according to a first embodiment of the present invention.

FIG. 1 is a schematic block diagram representing the arrangement of a semiconductor memory device 1000 according to the first embodiment of the present invention.

As shown in FIG. 1, semiconductor memory device 1000 is provided with control signal input terminal groups 2, 4, and 6 respectively receiving control signals such as an external row address strobe signal ext./RAS, an external column address strobe signal ext./CAS, an external write enable signal ext./WE from outside, an address input terminal group 8, a data input/output terminal group 9 for communicating a data signal, a ground terminal 12 receiving a ground potential Vss, and a power-supply terminal 10 receiving a power-supply potential ext. Vcc.

Semiconductor memory device 1000 is further provided with a control circuit 22 for receiving a control signal to generate an internal control signal for controlling an internal operation of semiconductor memory device 100, a row and column address buffer 24 for receiving an address signal from outside to generate an internal address signal, a row predecoder 26 for receiving a signal from row and column address buffer 24 to generate a row predecode signal for performing a row select, a row predecode line group PDL for transmitting the row predecode signal from row predecoder 26, a row decoder 27 for selecting a memory cell row (word line) from a memory cell array 32 based on the row predecode signal transmitted by row predecode line group PDL, an address bus ADB for transmitting the internal address signal from row and column address buffer 24, spare determination circuits 40.0 to 40.n−1 for storing a defective memory cell in a non-volatile manner in advance and for determining whether to perform a replacement of a normal memory cell row (word line) with a redundant memory cell row (word line), a column predecoder 26 for receiving a signal from row and column address buffer 24 to generate a column predecode signal for performing a column select, a sense amplifier+input/output control circuit 30, memory cell array 32, and a data input/output buffer 34.

Control circuit 22 generates a control clock corresponding to a prescribed operation mode based on external control signals such as external row address strobe signal ext./RAS and external column address strobe signal ext./CAS provided from outside via control signal input terminal groups 2 and 4, and controls the operation of the entire semiconductor memory device. Gate circuit 18 generates a signal for controlling the operation of data input/output buffer 34 during a write operation and a read operation according to an output from control circuit 22 and external write enable signal ext./WE.

Row and column address buffer circuit 24 generates internal address signals based on address signals A0 to Ai (i is a natural number) provided from outside, and provides the generated internal address signal to row predecoder 26, spare determination circuit 40, and column predecoder 28.

Memory cell array 32 is divided into a plurality of memory cell blocks MCB0 to MCBn. A normal memory cell block MCBi (0<i<n−1:n; a natural number) within memory cell array 32 is correspondingly provided with a redundant memory cell block RCBi (0<i<n−1) (not shown).

Semiconductor memory device 1000 is further provided with a column decoder 110.0 for selecting a column (bit line pair) within a corresponding memory cell block based on the column predecode signal from column predecoder 28, a sense amplifier SA provided corresponding to each bit line pair for amplifying storage data of a selected memory cell, and an I/O circuit for selectively transmitting data from the bit line pair selected by column decoder 110.0 to data input/output buffer 34. For convenience, FIG. 1 shows column decoder (YD) 110.0, sense amplifier and I/O circuit 30 together as one block.

A memory cell MC within memory cell array 32 designated by a normal row decoder 140.i within row decoder 27 or a redundant row decoder 142.i and a column decoder 110.0 communicates data with the outside through input/output terminal group 9 via sense amplifier +I/O circuit 30 and data input/output buffer 34.

Semiconductor memory device 1000 is further provided with an internal power-supply circuit 38 for receiving an external power-supply potential ext. Vcc and a ground potential Vss to generate an internal power-supply potential Vcc obtained by down-converting external power-supply potential ext. Vcc and a boosted potential Vpp obtained by boosting external power-supply potential ext. Vcc.

Moreover, the arrangement of semiconductor memory device 1000 shown in FIG. 1 is only one representative example, and the present application more generally is applicable to other arrangements of the dynamic semiconductor memory device. For instance, the manner of division of the memory cell array is not particularly restricted to the example of FIG. 1, and semiconductor memory device 1000 itself can be integrated onto one chip with other circuits.

Arrangement of a Row Select Circuit

Figure 2:
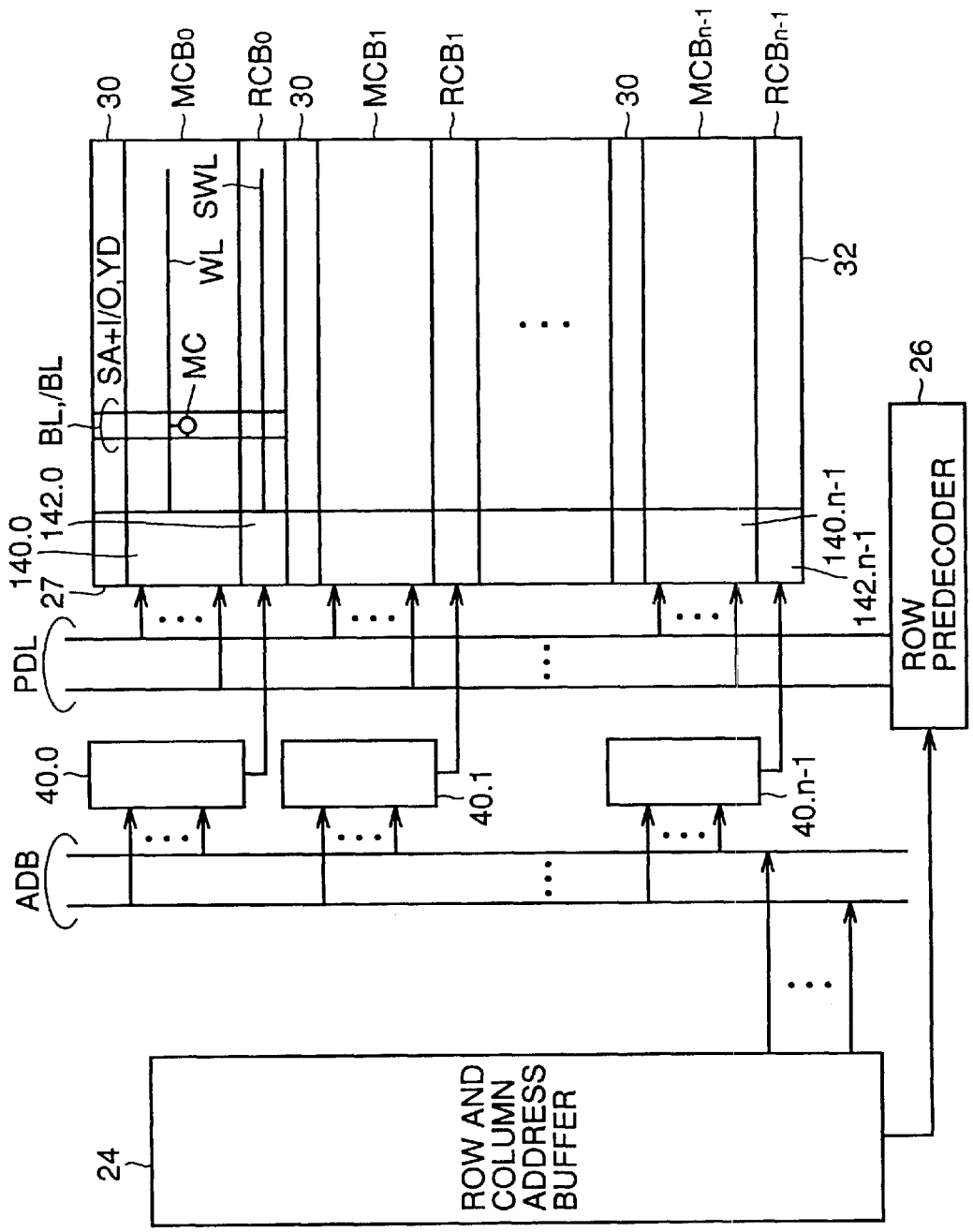
FIG. 2 is a block diagram representing the arrangement of a circuit portion for performing a row select in the arrangement of semiconductor memory device 1000 shown in FIG. 1.

FIG. 2 is a block diagram representing the arrangement of a circuit portion for performing a row select in the arrangement of semiconductor memory device 1000 shown in FIG. 1.

As shown in FIG. 2, a memory cell array 32 is divided into a plurality of memory cell blocks MCB0 to MCBn, as described above. A normal memory cell block MCBi (0<i<n−1:n; a natural number) within memory cell array 32 is correspondingly provided with a redundant memory cell block RCBi (0<i<n−1). A row decoder 27 includes a normal row decoder 140.i corresponding to normal memory cell block MCBi and a redundant row decoder 142.i corresponding to redundant memory cell block RCBi.

Spare determination circuits 40.0 to 40.n−1 are respectively provided to normal memory cell block MCBi, and as will be described in detail below, store a defective memory cell in advance in a non-volatile manner using a fuse element and the like, determine whether to perform a replacement of a memory cell row (word line WL) of normal memory cell block MCBi with a redundant memory cell row (redundant word line SVVL) of redundant memory cell block RCBi correspondingly provided to normal memory cell block MCBi based on an internal address signal transmitted by an address bus ADB, and provide instructions to normal row decoder 140.i and redundant row decoder 142.i.

Normal row decoder 140.i selects a memory cell row (word line WL) of a corresponding normal memory cell block MCBi based on a row predecode signal transmitted by a row predecode line group PDL. Redundant row decoder 142.i selects a redundant memory cell row (redundant word line SWL) of a corresponding redundant memory cell block RCBi based on an instruction from a corresponding spare determination circuit 40.i and on a predecode signal from row predecoder 26. When the selection of the redundant memory cell row is performed by redundant row decoder 142.i, the row select operation by normal row decoder 140.i is stopped.

A memory cell MC within memory cell array 32 designated by normal row decoder 140.i or redundant row decoder 142.i and a column decoder 110.0 communicates data with data input/output buffer 34 via a bit line pair BL and /BL and sense amplifier +I/O circuit 30.

Figure 3:
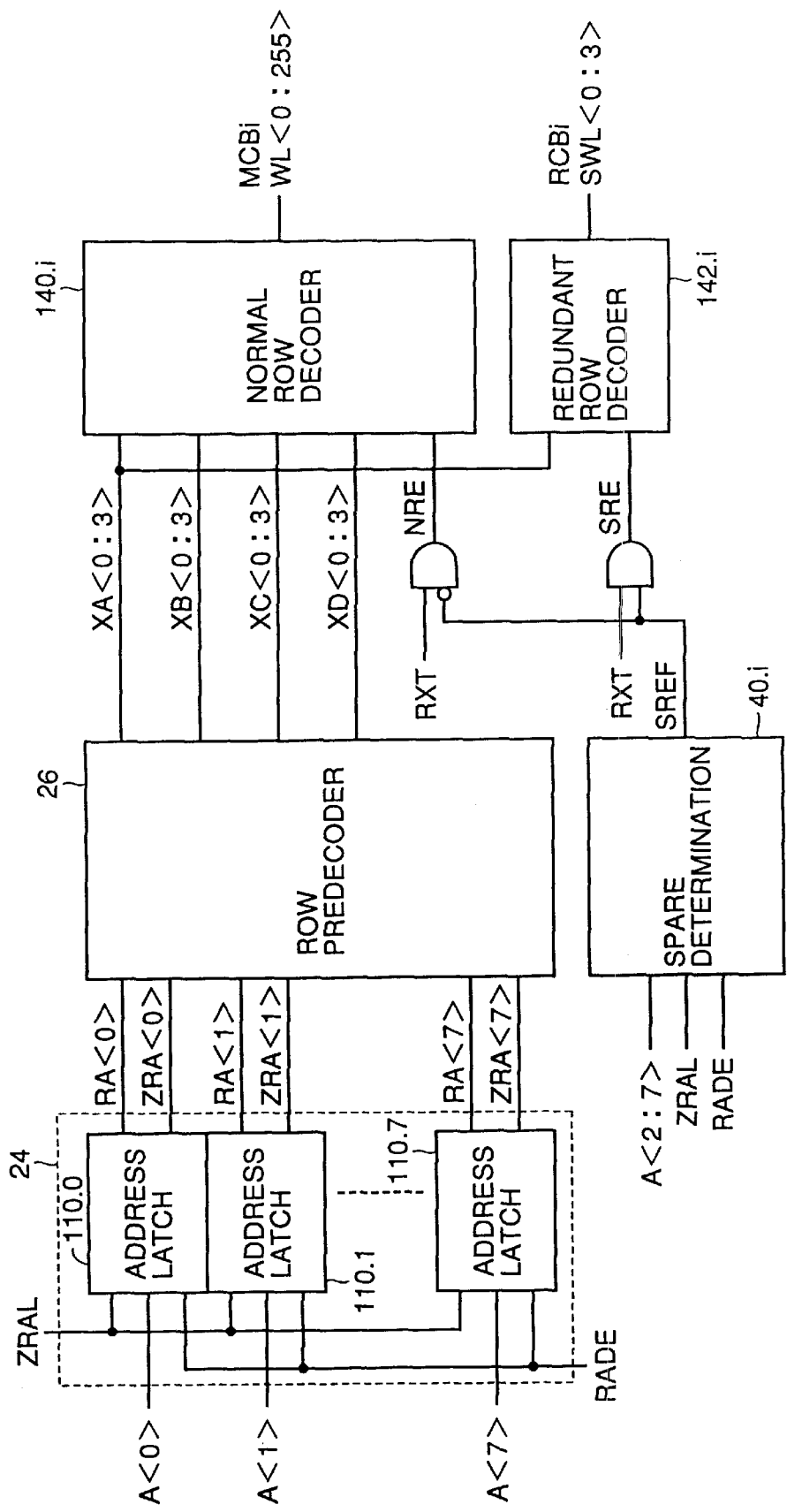
FIG. 3 is a schematic block diagram related to the description of a circuit arrangement for selecting a memory cell row from a memory cell block MCBi and a redundant memory cell block RCBi.

FIG. 3 is a schematic block diagram related to the description of a circuit arrangement for selecting a memory cell row from memory cell block MCBi and redundant memory cell block RCBi. In the following, for simplicity of description, a row address signal provided to row and column address buffer 28 consists of 8 bits of address signals A<0> to A<7>.

Here, memory cell block MCBi is provided with 256 word lines WL, and redundant memory cell block RCBi correspondingly provided to normal memory cell block MCBi is provided with four redundant memory cell rows to which four redundant word lines SWL are arranged.

As shown in FIG. 3, address latch circuits 110.0 to 110.7, which are respectively provided for address signals A<0> to A<7> in row and column address buffer 24, latch corresponding address signals when signal ZRAL is in the active state, and output internal address signals RA<0>, ZRA<0>, RA<1>, ZRA<1>, ... RA<7>, ZRA<7> according to signal RADE.

For instance, an address latch 110.0 receives an address signal A<0> and outputs internal address signals RA<0> and ZRA<0>.

Row predecoder 26 receives internal address signals RA<0>, ZRA<0> to RA<7>, ZRA<7> output from address latch circuits 1 10.0 to 110.7 and outputs predecode signals XA<0:3>, XB<0:3>, XC<0:3> and XD<0:3>. Here, signals XA<0:3> together denote signals XA<0> to XA<3>.

On the other hand, spare determination circuit 40.i is activated by signal ZRAL, receives address signals A<2:7> (=A<2> to A<7>), and outputs a result of comparison with the defective row address stored in advance according to signal RADE. Logic gate 132 receives signal RXT and a determination signal output from spare determination circuit 40.i, and outputs signal NRE which attains the active state ("H" level) when no match is detected between address signals A<0> to A<7> and a redundant memory cell row address as a result of a spare determination and which attains the inactive state ("L" level) when a match with the redundant memory cell row address is detected.

Logic gate 134 receives signal RXT and an output from spare determination circuit 40.i, and outputs signal SRE which attains the active state ("H" level) when a match occurs between a redundant memory cell row and address signals A<0> to A<7> provided from outside and which attains the inactive state ("L" level) when no match occurs.

Normal row decoder 140.i receives predecode address signals XA<0:3> to XD<0:3>, and activates one of word lines WL<0:255> (WL<0> to WL<255>) within a corresponding normal memory cell block MCBi when signal NRE is in the active state.

On the other hand, redundant row decoder 142.i receives predecode signals XA<0:3> and signal SRE, and activates one of redundant word lines SWL<0:3> (SWL<0> to SWL<3>) within redundant memory cell block RCBi according to the activation of signal SRE when a redundant memory cell row and the provided address signal match in spare determination circuit 40.i.

Figure 4:
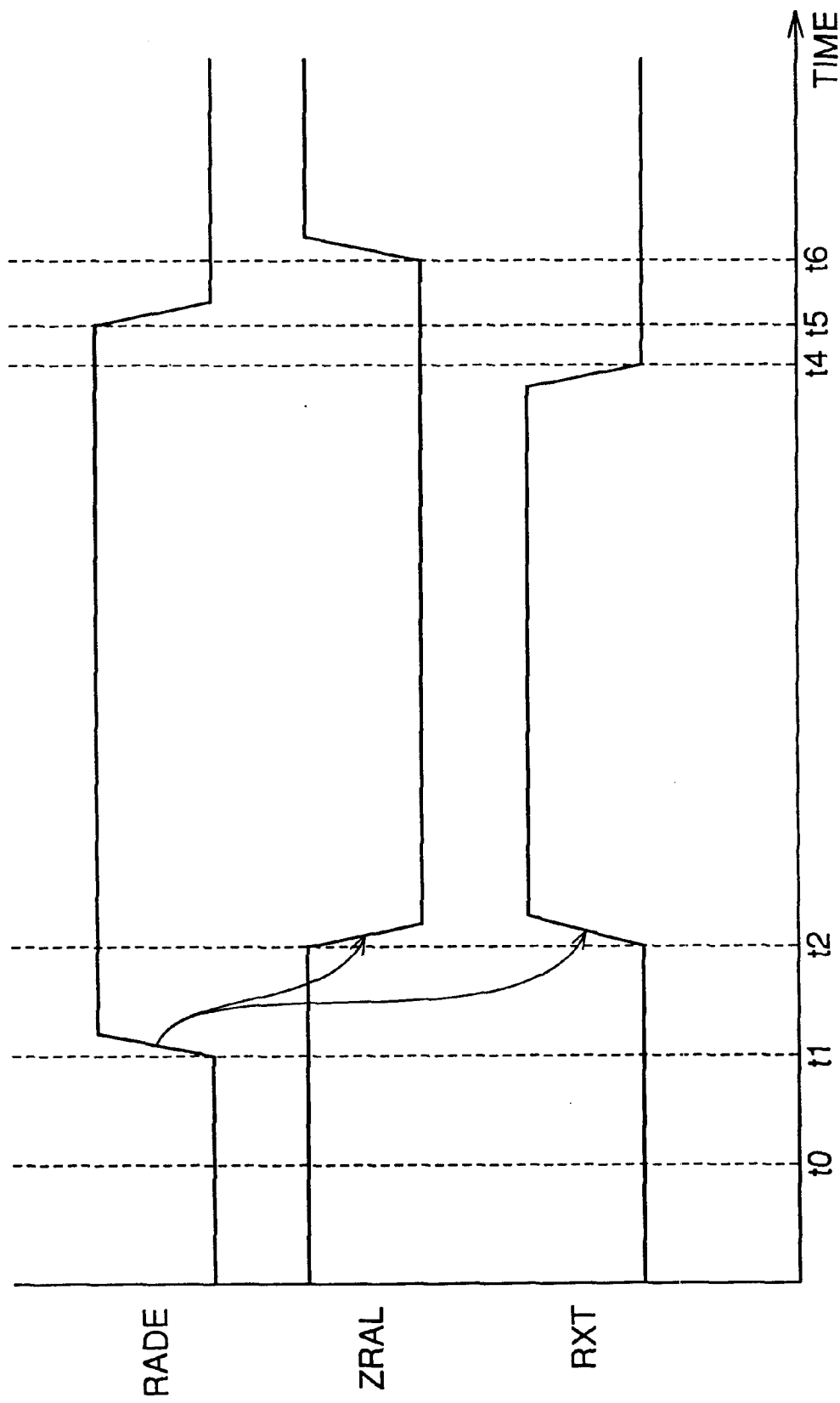
FIG. 4 is a timing chart related to the description of an operation of a circuit for selecting a cell row shown in FIG. 3.

FIG. 4 is a timing chart related to the description of an operation of a circuit for selecting a cell row shown in FIG. 3.

When an address signal is provided from outside, according to the active state of signal ZRAL at time t0, address latches 110.0 to 110.7 latch in address signals A<0> to A<7>.

Thereafter, according to the activation of signal RADE at time t1, signal RXT for instructing the start of the selecting operation of a word is activated substantially at the same time as the inactivation of signal ZRAL at time t2.

Figure 16:
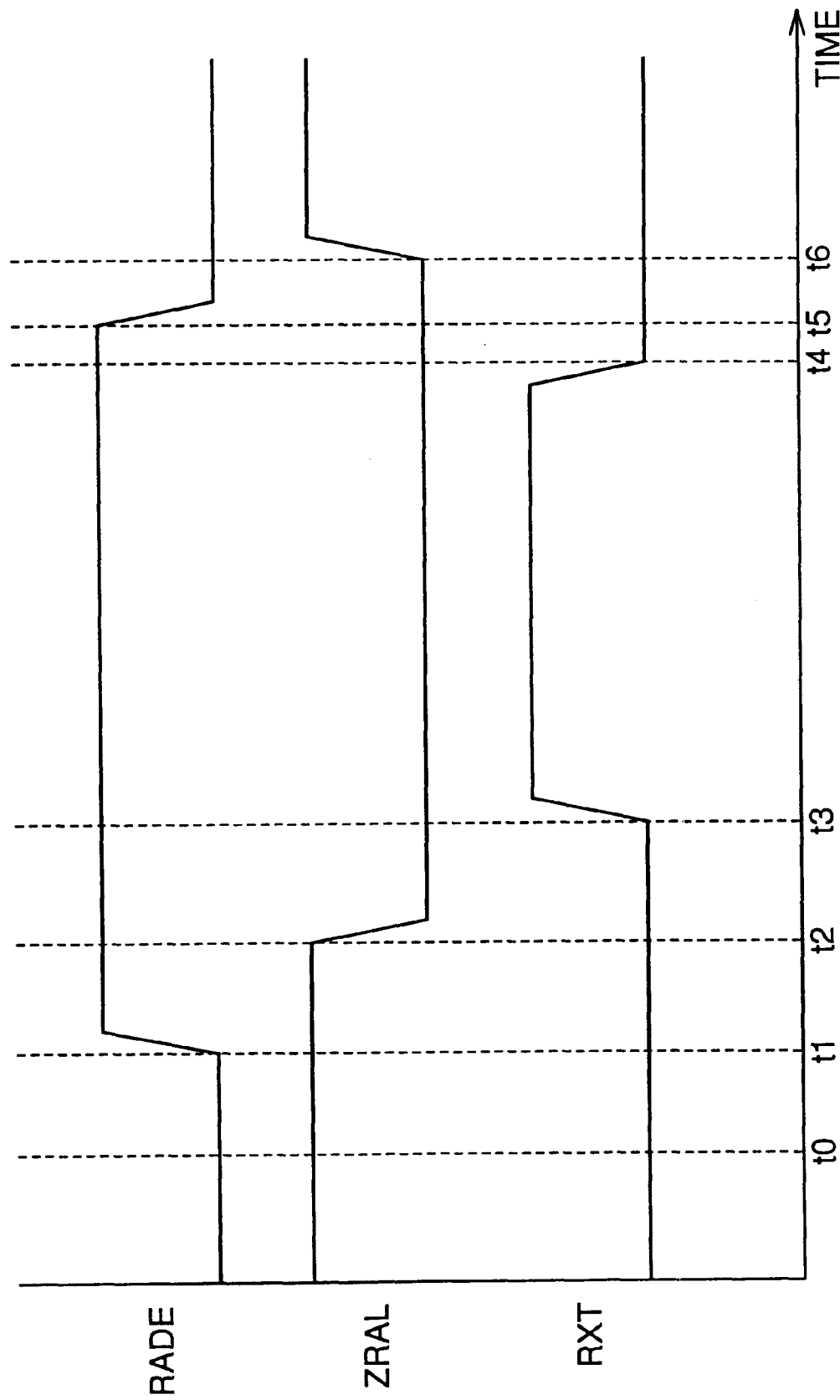
FIG. 16 is a timing chart related to the description of an operation of a circuit for selecting a cell row shown in FIG. 14.

Thus, unlike the conventional example shown in FIG. 16, there is no need to allow the time margin including the waiting time for the determination result of the redundant row and the delay time required for a predecode operation from the inactivation of signal ZRAL to the activation of signal RXT so that a higher-speed row select operation can be achieved.

Figure 5:
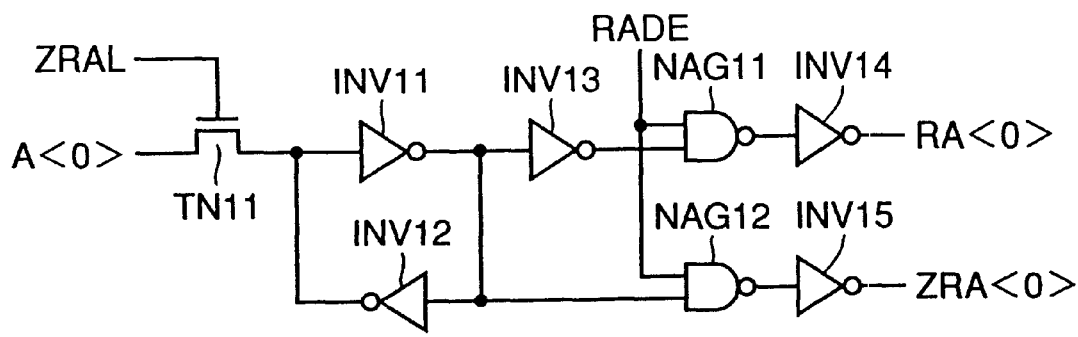
FIG. 5 is a circuit diagram related to the description of the arrangement of an address latch 110.0 shown in FIG. 3.

FIG. 5 is a circuit diagram related to the description of the arrangement of address latch 110.0 shown in FIG. 3.

The arrangement for other address latch circuits 110.1 to 110.7 is basically the same, except for the signals that are input.

As shown in FIG. 5, address latch circuit 110.0 includes an N-channel MOS transistor TN11 for receiving an address signal A<0> at a drain and a signal ZRAL at a gate, an inverter INV11 having an input node coupled to a source of N-channel MOS transistor TN11, an inverter INV12 forming a latch circuit for receiving an output from inverter INV11 at an input node and having an output coupled to an output node of inverter INV11, an inverter INV13 for receiving an output from inverter INV11, an NAND circuit NAD11 for receiving a signal RADE at one input node and for receiving an output from inverter INV13 at the other input node, an NAND circuit NAD12 for receiving signal RADE at one input node and having the other input node coupled to an output of inverter INV11, an inverter INV14 for receiving an output from NAND circuit NAD11 and outputting internal address signal RA<0>, and inverter INV15 for receiving an output from NAND circuit NAD12 and outputting an internal address signal ZRA<0>.

Internal address signals RA<0> and ZRA<0> are complementary signals.

Figure 6:
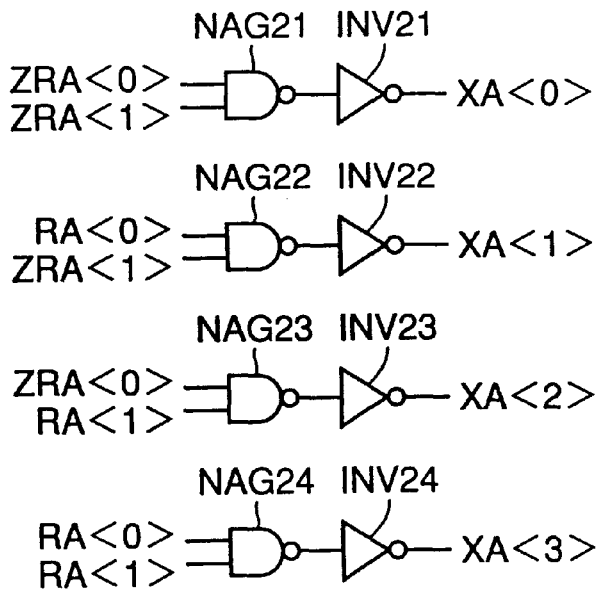
FIG. 6 is a circuit diagram related to the description of a portion of the arrangement of a row predecoder 26 shown in FIG. 3.

FIG. 6 is a circuit diagram related to the description of a portion of the arrangement of row predecoder 26 shown in FIG. 3.

Row predecoder 26 includes, as an arrangement corresponding to row address signals RA<0>, RA<1>, ZRA<0>, and ZRA<1>, an NAND circuit NAG21 for receiving signal ZRA<0> and signal ZRA<1>, an inverter INV21 for receiving an output from NAND circuit NAG21 and outputting a predecode signal XA<0>, an NAND circuit NAG22 for receiving signal RA<0> and signal ZRA<1>, an inverter INV22 for receiving an output from NAND circuit NAG22 and outputting a predecode signal XA<1>, an NAND circuit NAG23 for receiving signal ZRA<0> and signal RA<1>, an inverter INV23 for receiving an output from NAND circuit NAG23 and outputting a predecode signal XA<2>, an NAND circuit NAG24 for receiving signal RA<0> and signal RA<1>, and an inverter INV24 for receiving an output from NAND circuit NAG24 and outputting a predecode signal XA<3>.

A similar arrangement is provided for signals RA<2>, ZRA<2>, RA<3>, and ZRA<3> for outputting predecode signals XB<0> to XB<3>.

Similarly, the arrangement corresponding to signals RA<4>, ZRA<4>, RA<5>, and ZRA<5> for outputting predecode signals XC<0> to XC<3>, and the arrangement corresponding to signals RA<6>, ZRA<6>, RA<7>, and ZRA<7> for outputting predecode signals XD<0> to XD<3> are provided.

Figure 7:
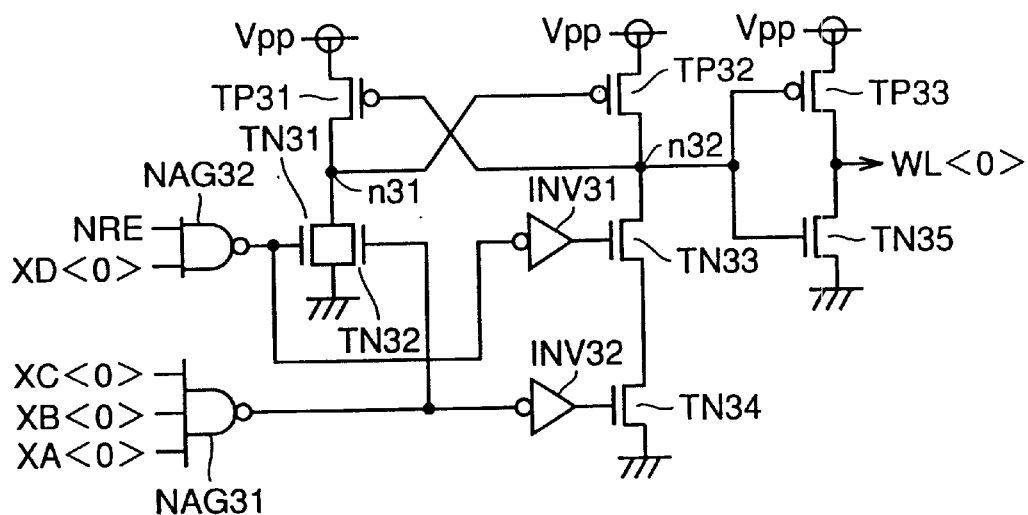
FIG. 7 is a circuit diagram related to the description of the arrangement of a normal row decoder 140.i in the arrangement shown in FIG. 3.

FIG. 7 is a circuit diagram related to the description of the arrangement of normal row decoder 140.$i$ in the arrangement shown in FIG. 3 .

In FIG. 7, only the arrangement for receiving predecode signals XA<0>, XB<0>, XC<0>, and XD<0> of the predecode signals for driving corresponding word lines is selectively shown. In practice, similar arrangements are provided corresponding to other combinations of predecode signals XA<0:3> to XD<0:3> for driving the corresponding word lines.

Thus, FIG. 7 shows a row decoder portion circuit 140.$i$ 0 of normal row decoder 140.$i$.

Row decoder portion circuit 140.$i$0 includes a 3-input NAND circuit NAG31 for receiving predecode signals XA<0>, XB<0>, and XC<0>, an NAND circuit NAG32 for receiving a signal NRE and a predecode signal XD<0>, a P-channel MOS transistor TP31 provided between a boosted potential Vpp and an internal node n31, an N-channel MOS transistor TN31 provided between internal node n31 and a ground potential GND for receiving an output from NAND circuit NAG32 at a gate, an N-channel MOS transistor TN32 provided between internal node n31 and ground potential GND for receiving an output from NAND circuit NAG31 at a gate, a P-channel MOS transistor TP32 provided between boosted potential Vpp and an internal node n32 and having a gate connected to internal node n31, N-channel MOS transistors TN33 and TN34 connected in series between internal node n32 and ground potential GND, an inverter INV31 for receiving an output from NAND circuit NAG32 and for providing the inverted signal to a gate of N-channel MOS transistor TN33, an inverter INV32 for receiving an output from NAND circuit NAG31 and for providing the inverted signal to a gate of N-channel MOS transistor TN34, and a P-channel MOS transistor TP33 and an N-channel MOS transistor TN35 connected in series between boosted potential Vpp and ground potential GND.

The gate of transistor TP31 is connected to internal node n32, and the gates of transistors TP33 and TN35 are also connected to internal node n32.

The node connecting transistors TP33 and TN35 is connected to a corresponding word line WL<0>.

Figure 8:
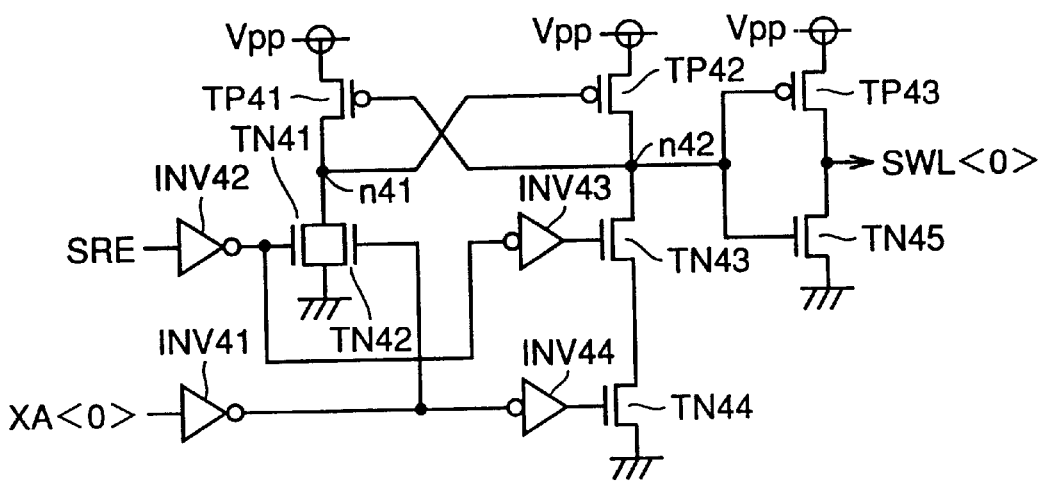
FIG. 8 is a circuit diagram related to the description of the arrangement of a redundant row decoder portion circuit 142.i0 for activating a spare word line SWL<0>.

FIG. 8 is a circuit diagram related to the description of the arrangement of a redundant row decoder portion circuit 142.$i$0 for activating a spare word line SWL<0> within redundant row decoder 142.$i$ shown in FIG. 3.

In FIG. 8, only the arrangement for receiving predecode signal XA<0> among the predecode signals and driving a corresponding word line is selectively shown. In practice, similar arrangements are provided corresponding to other bits of predecode signals XA<0:3> and drive the corresponding word lines.

Redundant row decoder portion circuit 142.$i$0 includes an inverter INV41 for receiving predecode signal XA<0>, an inverter INV42 for receiving signal SRE, a P-channel MOS transistor TP41 provided between a boosted potential Vpp and an internal node n41, an N-channel MOS transistor TN41 provided between internal node n41 and a ground potential GND for receiving an output from inverter INV42 at a gate, an N-channel MOS transistor TN42 provided between internal node n41 and ground potential GND for receiving an output from inverter INV41 at a gate, a P-channel MOS transistor TP42 provided between boosted potential Vpp and internal node n42 and having a gate connected to internal node n41, N-channel MOS transistors TN43 and TN44 provided in series between internal node n42 and ground potential GND, an inverter INV43 for receiving an output from inverter INV42 and for providing an inverted signal to a gate of N-channel MOS transistor TN43, an inverter INV44 for receiving an output from inverter INV41 and providing an inverted signal to a gate of N-channel MOS transistor TN44, and a P-channel MOS transistor TP43 and an N-channel MOS transistor TN45 connected in series between boosted potential Vpp and ground potential GND.

The gate of transistor TP41 is connected to internal node n42, and the gates of transistors TP43 and TN45 are also connected to internal node n42.

The node connecting transistors TP43 and TN45 is connected to a corresponding word line SWL<0>.

Figure 9:
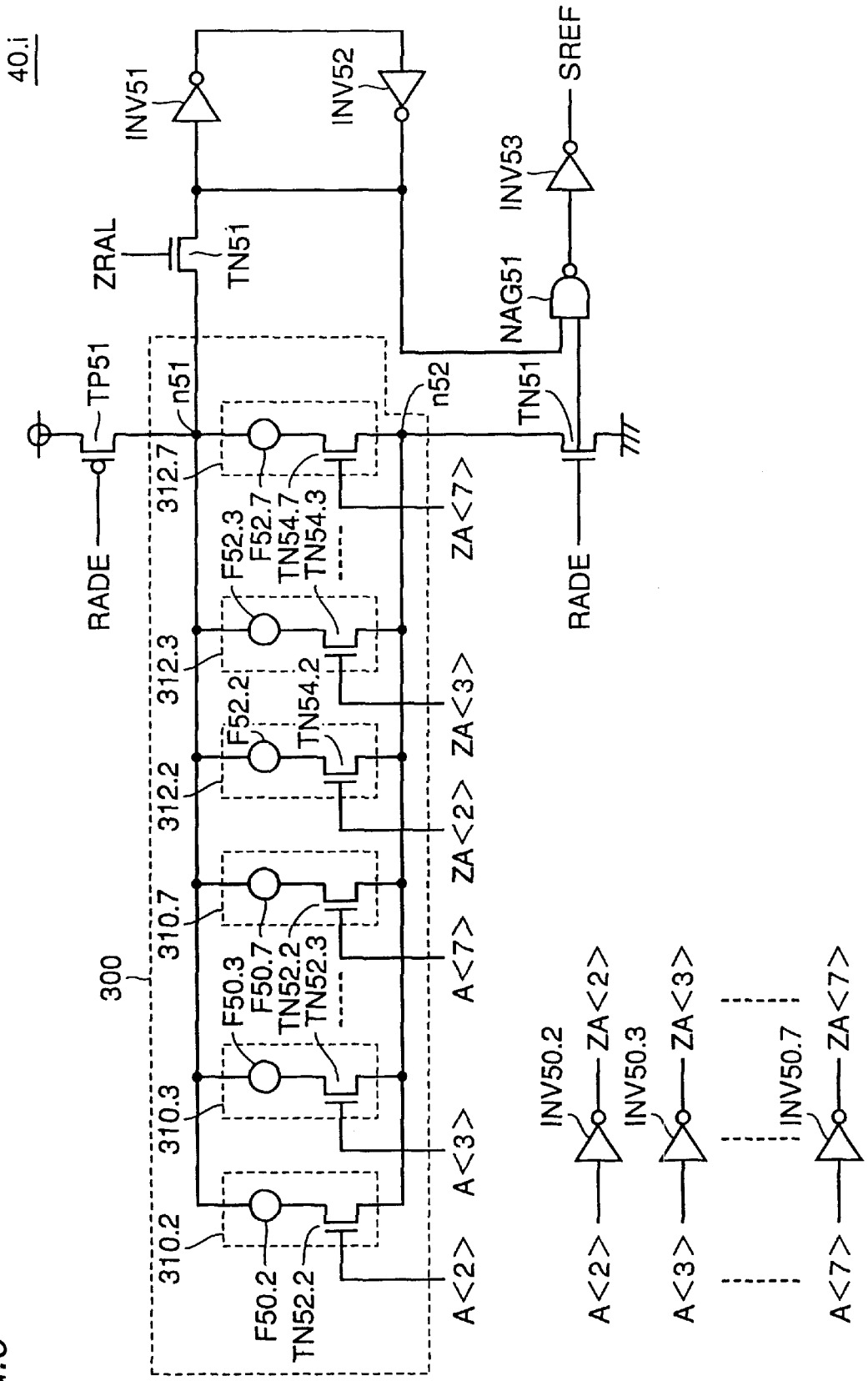
FIG. 9 is a circuit diagram related to the description of the arrangement of a spare determination circuit 40.i shown in FIG. 3.

FIG. 9 is a circuit diagram related to the description of the arrangement of spare determination circuit 40.$i$ shown in FIG. 3.

Spare determination circuit 40.$i$ includes a defective address comparing portion 300 including a plurality of fuse elements and storing a defective address row for outputting a comparison result of internal address signals A<2> to A<7>, ZA<2> to ZA<7> with a stored defective row address, a P-channel MOS transistor TP51 controlled according to signal RADE for supplying a power-supply potential Vcc to defective address comparing portion 300, an N-channel MOS transistor TN51 controlled by signal RADE for supplying a ground potential GND to defective address comparing portion 300, an N-channel MOS transistor TN51 having a drain electrode connected to an output node of defective address comparing portion 300 for receiving signal ZRAL as a gate potential, an inverter INV51 having an input node connected to a source of transistor TN51, an inverter INV52 forming a latch circuit for receiving an output from inverter INV51 and having an output node connected to the input node of inverter INV51, an NAND circuit NAG51 for receiving an output from inverter INV52 and signal RADE, and an inverter INV53 for receiving and inverting an output from NAND circuit NAG51 and outputting a signal SREF.

Spare determination circuit 40.i further includes inverters INV50.2 to INV50.7 for receiving and inverting signals A<2> to A<7> and outputting internal address signal ZA<2> to ZA<7>.

Defective address comparing portion 300 includes address comparing portions 310.2 to 310.7 connected in parallel between an internal node n51 to which a power-supply potential Vcc is selectively supplied by transistor TP51 and an internal node n52 to which a ground potential GND is selectively supplied by transistor TN51, and address comparing portions 312.2 to 312.7 connected in parallel between node n51 and internal node n52 in a similar manner.

Address comparing portion 310.2 includes a fuse element F50.2 and an N-channel MOS transistor TN52.2 connected in series between internal node n51 and internal node n52. Other address comparing portions 310.3 to 310.7 are formed in the similar manner.

Similarly, address comparing portion 312.2 includes a fuse element F52.2 and an N-channel MOS transistor TN54.2 connected in series between internal node n51 and internal node n52.

Transistor TN52.2 receives address signal A<2> at a gate, and transistor TN54.2 receives an internal address signal ZA<2> at a gate.

The arrangements of other address comparing portions 310.3 to 312.7 are the same as the arrangement of address comparing portion 310.2, except that the internal address signals that are input are A<3> to A<7>, respectively, instead of A<2>.

Moreover, the arrangements of other address comparing portions 312.3 to 312.7 are the same as the arrangement of address comparing portion 312.2 except that the internal address signals that are input are ZA<3> to ZA<7>, respectively, instead of ZA<2>.

With the above-described arrangement, node n51 is precharged while signal RADE is at the "L" level. Thereafter, signal RADE attains the "H" level, and transistor TP51 enters the off state while transistor TN51 enters the on state. When internal address signals A<2> to A<7>, ZA<2> to ZA<7> are respectively input into address comparing portions 310.2 to 310.7 and 312.2 to 312.7, internal node n51 maintains the "H" level if a match occurs between an internal address signal and a defective row address programmed by cutting fuse elements in advance, and changes to the "L" level when no match occurs.

Thus, since signal ZRAL is at the "H" level, the level of node n51 is held by the latch circuit formed by inverters INV51 and INV52.

Consequently, when an input address signal matches the programmed defective address, a signal of the "H" level is output from inverter INV52.

Accordingly, a signal of the "L" level is output from NAND circuit NAG51, and signal SREF output from inverter INV53 becomes a signal of the "H" level.

Thus, in spare determination circuit 40.i, when the defective row address programmed in advance matches the input address signal, signal SREF of the "H" level is output.

Since external address signals A<2:7> (A<2> to A<7>) instead of a signal having been predecoded are input to a spare determination circuit thus configured, a predecode processing for a normal memory cell array and a spare determination processing for redundant memory cell are performed in parallel so that the time required for a redundant memory cell row to be selected can be reduced even when a normal memory cell is replaced by a redundant memory cell.

Modification to the First Embodiment

Figure 10:
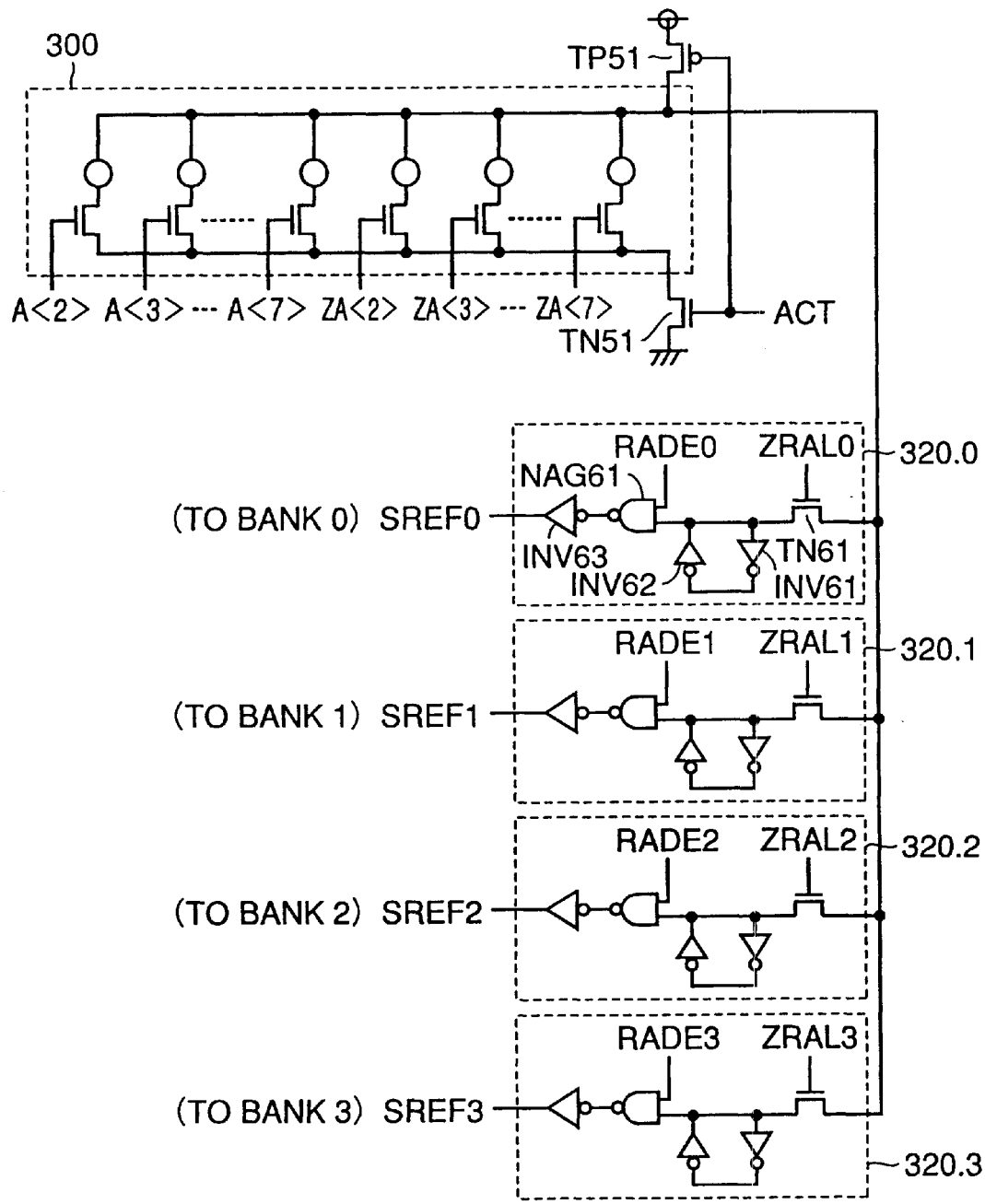
FIG. 10 is a schematic block diagram representing the arrangement of a spare determination circuit 41 of a modification to the first embodiment of the present invention.

FIG. 10 is a schematic block diagram representing the arrangement of a spare determination circuit 41 of a modification to the first embodiment of the present invention.

Spare determination circuit 41 is provided with a defective address comparing portion 300, a P-channel MOS transistor TP51 controlled by a signal ACT for selectively supplying a power-supply potential Vcc to defective address comparing portion 300, and an N-channel MOS transistor TN51 controlled by signal ACT for selectively supplying a ground potential GND to defective address comparing portion 300. The arrangement of this portion is the same as the arrangement of spare determination circuit 40.i of the first embodiment shown in FIG. 9.

The arrangement of spare determination circuit 41 differs from the arrangement of spare determination circuit 40.i in that an output from defective address comparing portion 300 is supplied to spare determination signal generating circuits 320.0 to 320.3 corresponding to the respective banks.

In other words, a spare determination signal generating circuit 320.0 receives the output from defective address comparing portion 300 and outputs a spare determination signal SREF0 corresponding to a bank 0.

Similarly, spare determination signal generating circuits 320.1 to 320.3 output spare determination signals SREF1 to SREF3 for the respective banks 1 to 3.

Spare determination signal generating circuit 320.0 includes an N-channel MOS transistor TN61 for receiving an output from a spare address storage portion 300 at a drain and for receiving a signal ZRAL0 at a gate, an inverter INV61 having an input node connected to a source of transistor TN61, an inverter INV62 for receiving an output from inverter INV61 and having an output node connected to the input node of inverter INV61, an NAND circuit NAG61 for receiving an output from inverter INV62 and a signal RADE0, and an inverter INV63 for receiving and inverting an output from NAND circuit NAG61 and outputting signal SREF0.

Signal ZRAL0 and signal RADE0 are generated by a control circuit 22 according to the activation of bank 0.

With the above-described arrangement, the same effects as those produced by the first embodiment can be obtained, while the reduction in circuit area can be achieved by having defective address comparing portion 300 shared by a plurality of banks in a semiconductor memory device having a multi-bank arrangement (for instance, of four banks).

Second Embodiment

Figure 11:
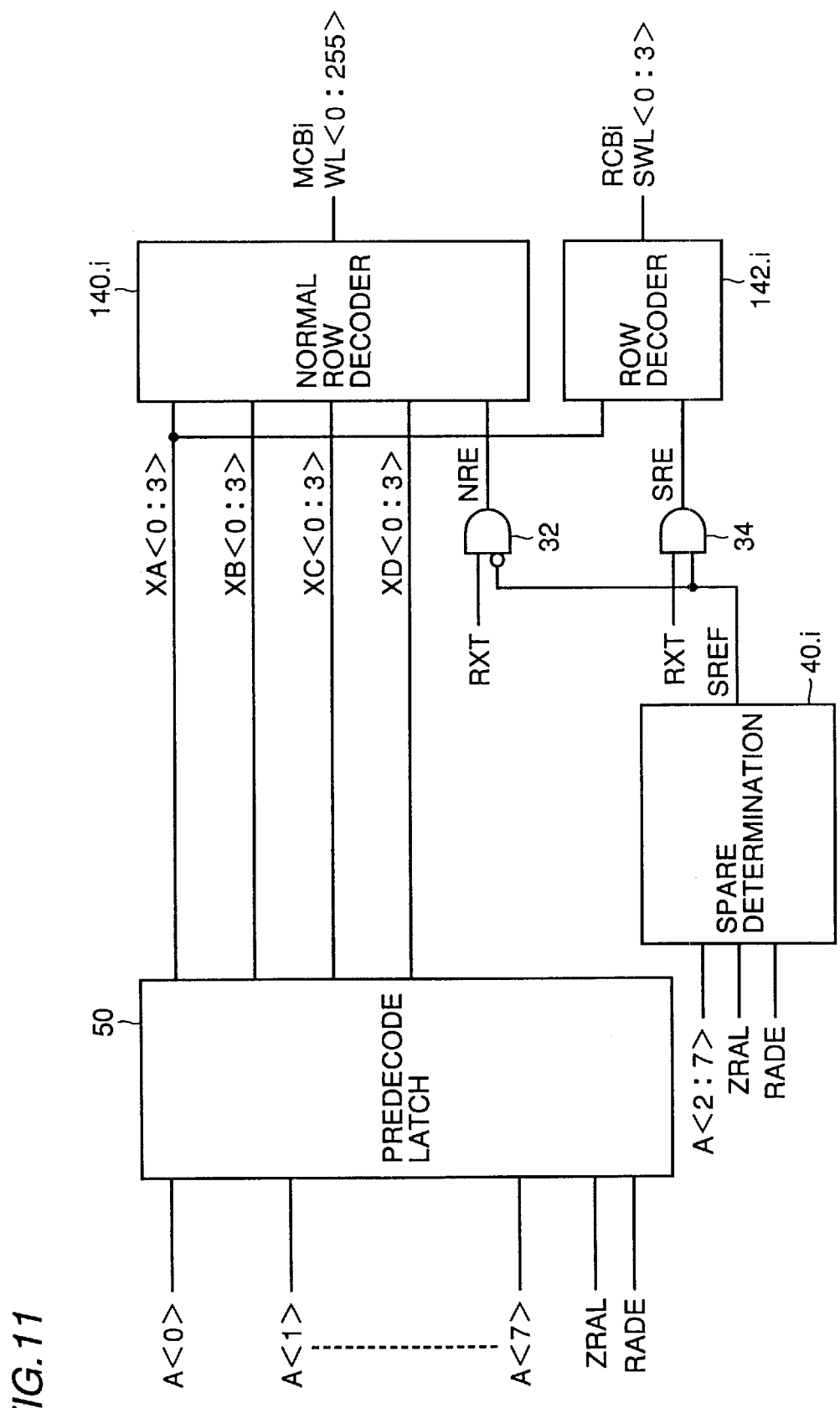
FIG. 11 is a schematic block diagram related to the description of the arrangement of a row select circuit in semiconductor memory device 1000 according to a second embodiment of the present invention.

FIG. 11 is a schematic block diagram related to the description of the arrangement of a row select circuit in semiconductor memory device 1000 according to the second embodiment of the present invention.

The arrangement of the row select circuit according to the second embodiment differs from the arrangement of the row select circuit according to the first embodiment shown in FIG. 3 in that a predecode latch circuit 50 is provided in place of address latch circuits 110.0 to 110.7 and a predecoder circuit 26.

Other parts of this arrangement is the same as the corresponding parts in the arrangement of the row select circuit of the first embodiment shown in FIG. 3 so that the corresponding parts are denoted by the same reference characters and the description thereof will not be repeated.

Predecode latch circuit 50 receives address signals A<0> to A<7> at the time of activation of address signal ZRAL, and generates predecode signals XA<0:3> to XD<0:3> at the time of activation of signal RADE.

Figure 12:
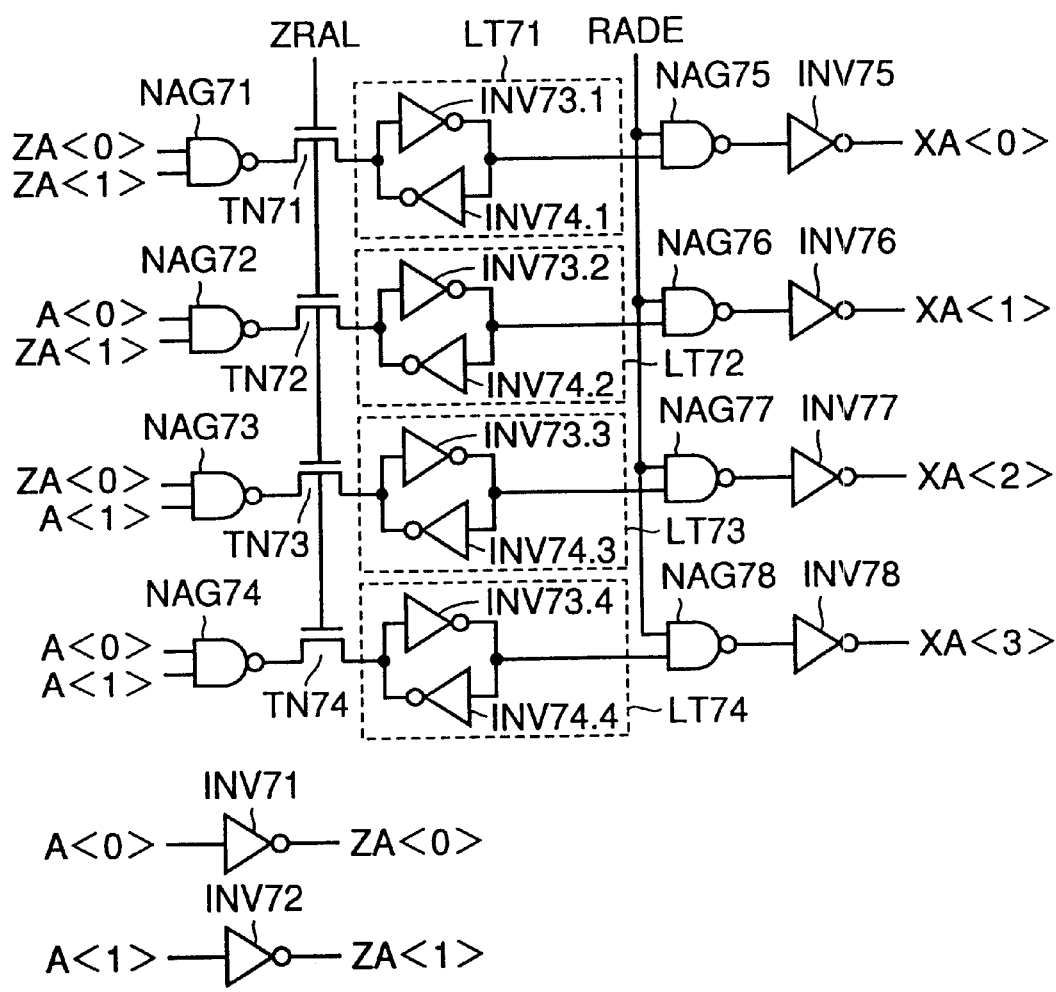
FIG. 12 is a schematic block diagram related to the description of the arrangement of a predecode latch circuit 50 shown in FIG. 11.

FIG. 12 is a schematic block diagram related to the description of the arrangement of predecode latch circuit 50 shown in FIG. 11.

In FIG. 12, only the portion related to address signals A<0> and A<1> and to internal address signals ZA<0> and ZA<1> complementary to address signals A<0> and A<1> is selectively shown from the arrangement of predecode latch circuit 50 shown in FIG. 11.

Predecode latch circuit 50 includes an inverter INV71 for receiving and inverting address signal A<0> and outputting signal ZA<0>, and an inverter INV72 for receiving and inverting signal A<1> and outputting signal ZA<1>.

Predecode latch circuit 50 further includes an NAND circuit NAG71 for receiving signals ZA<0> and ZA<1>, an NAND circuit NAG72 for receiving address signals A<0> and ZA<1>, an NAND circuit NAG73 for receiving address signals ZA<0> and A<1>, an NAND circuit NAG74 for receiving address signals A<0> and A<1>, a latch circuit LT71 connected to NAND circuit NAG71 via an N-channel MOS transistor TN71, a latch circuit LT72 connected to NAND circuit NAG71 via an N-channel MOS transistor TN72, a latch circuit LT73 connected to NAND circuit NAG73 via a transistor TN73, and a latch circuit LT74 connected to NAND circuit NAG74 via a transistor TN74.

The gates of transistors TN71 to TN74 are all controlled by signal ZRAL.

Latch circuit LT71 includes an inverter INV73.1 for receiving and inverting a potential of an input node of latch circuit LT71 to which an output from NAND circuit NAG71 is provided via transistor TN71, and an inverter INV74.1 for receiving an output from inverter INV73.1 and having an output node connected to an input node of inverter INV73.1. Other latch circuits LT72 to LT74 have the same arrangement.

Predecode latch circuit 50 is further provided with an NAND circuit NAG75 for receiving signal RADE at one input node and for receiving an output from latch circuit LT71 at the other input node, an inverter INV75 for receiving and inverting an output from NAND circuit NAG75 and outputting predecode signal XA<0>, an NAND circuit NAG76 for receiving signal RADE at one input node and receiving an output from latch circuit LT72 at the other input node, an inverter INV76 for receiving and inverting an output from NAND circuit NAG76 and outputting predecode signal XA<1>, an NAND circuit NAG77 for receiving signal RADE at one input node and receiving an output from latch circuit LT73 at the other input node, an inverter INV77 for receiving and inverting an output from NAND circuit NAG77 and outputting predecode signal XA<2>, an NAND circuit NAG78 for receiving signal RADE at one input node and receiving an output from latch circuit LT74 at the other input node, and an inverter INV78 for receiving and inverting an output from NAND circuit NAG78 and outputting predecode signal XA<3>.

With the above-described arrangement, like the row select circuit according to the first embodiment, a predecode processing for a normal memory cell array and a spare determination processing for a redundant memory cell are performed in parallel so that the time required for a redundant memory cell row to be selected is reduced even when a normal memory cell is replaced by a redundant memory cell.

Modification to the Second Embodiment

Figure 13:
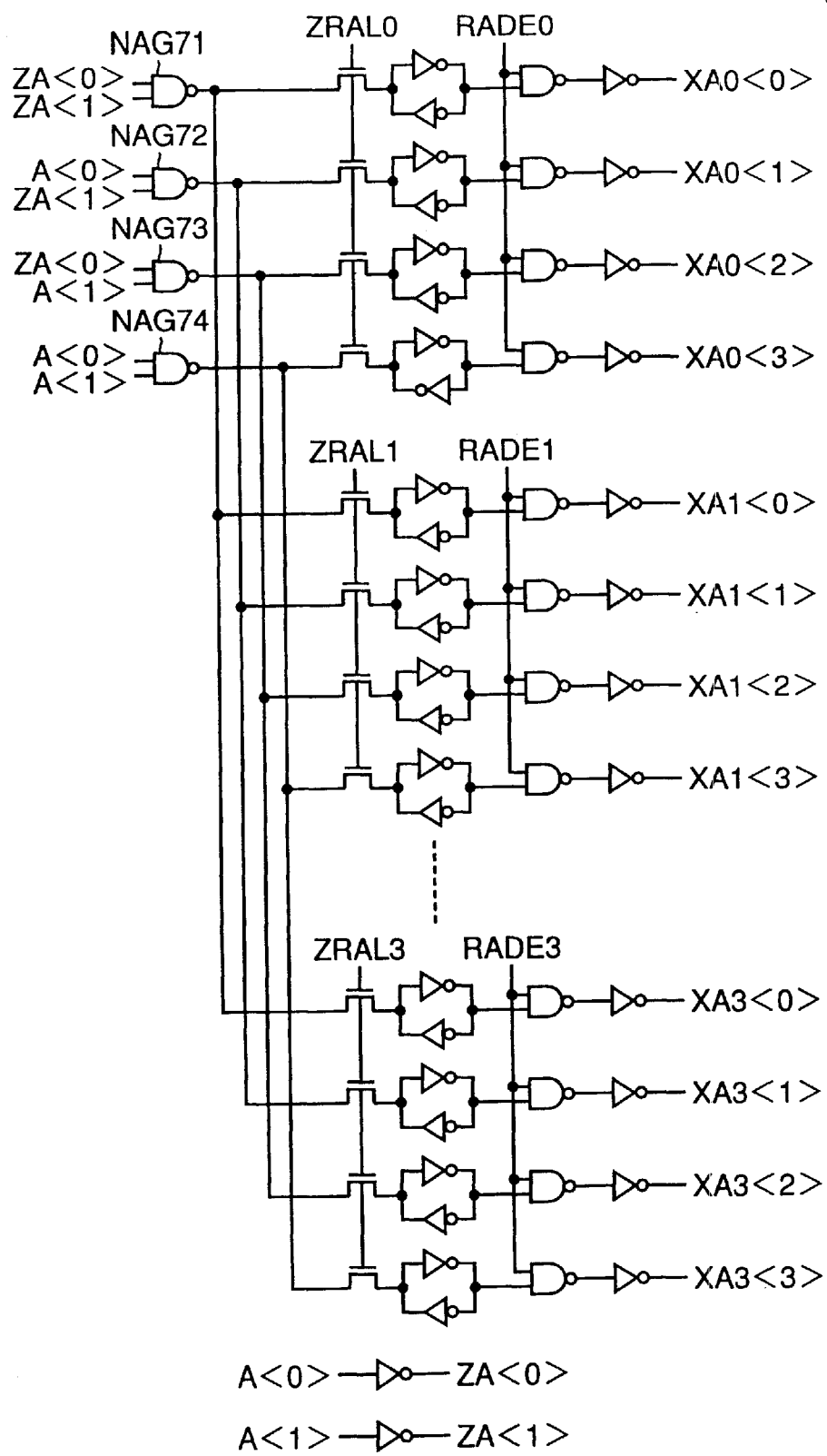
FIG. 13 is a schematic block diagram representing the arrangement of a predecode latch circuit 52 of a modification to the second embodiment.
Figure 14:
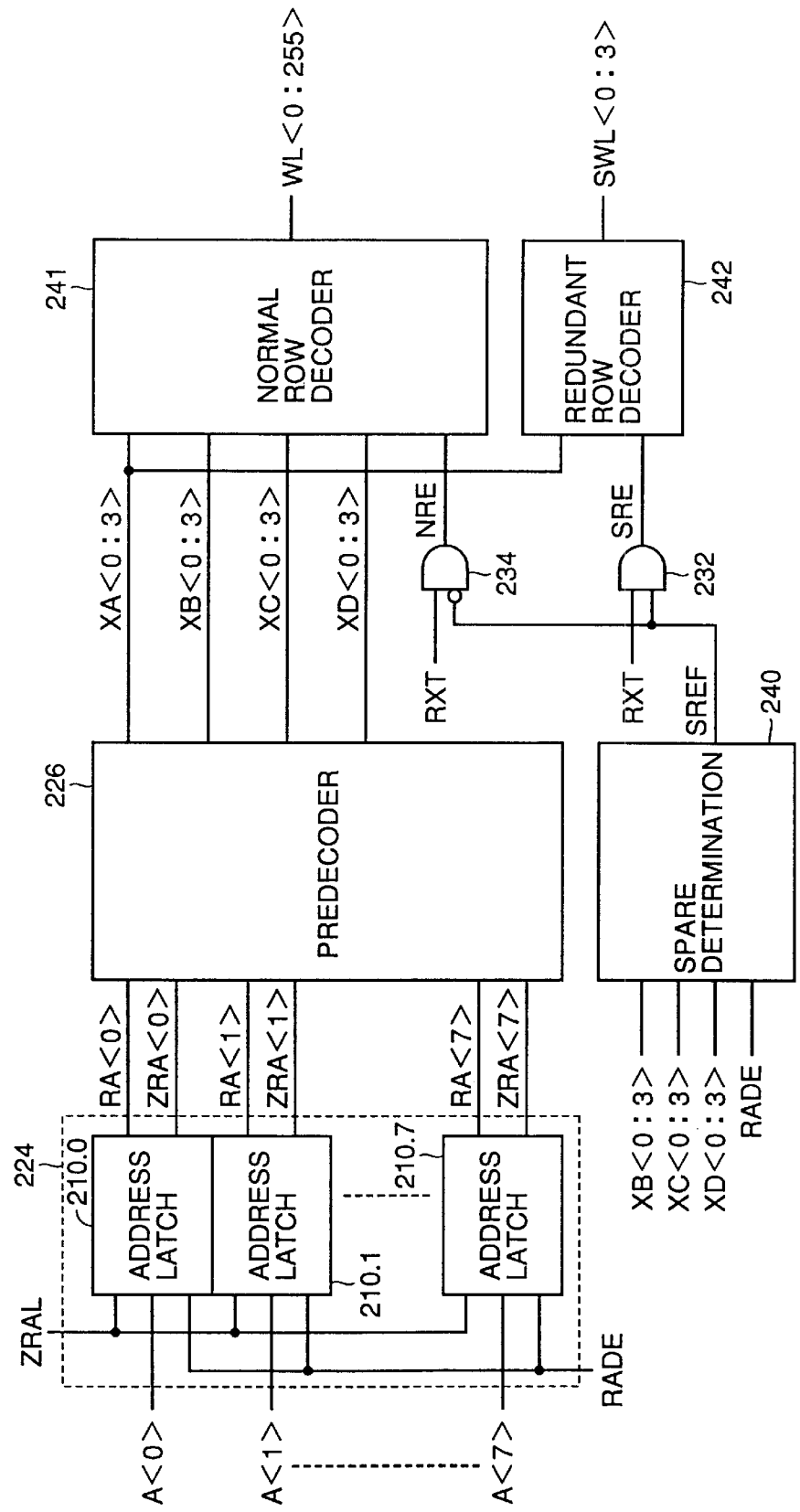
FIG. 14 is a schematic block diagram related to the description of a circuit arrangement for selecting a memory cell row from a memory cell array in a conventional semiconductor memory device.
Figure 15:
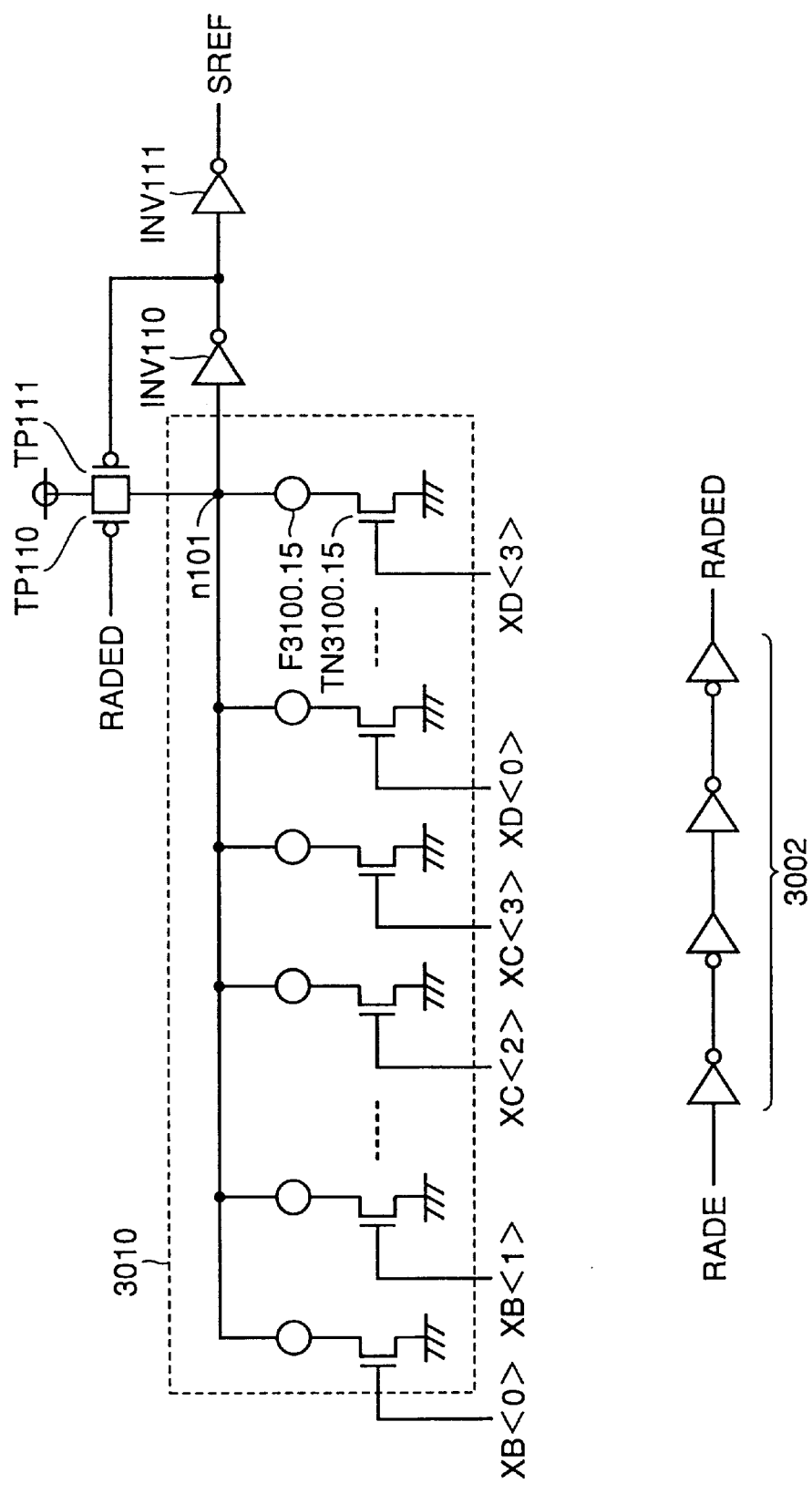
FIG. 15 is a schematic block diagram related to the description of the arrangement of a spare determination circuit 240 shown in FIG. 14.

FIG. 13 is a schematic block diagram representing the arrangement of a predecode latch circuit 52 of the modification to the second embodiment.

The arrangement of predecode latch circuit 52 differs from the arrangement of predecode latch circuit 50 in that, in predecode latch circuit 52, the predecode latch circuits provided for the respective banks corresponding to four banks share NAND circuits NAG71 to NAG74.

Accordingly, for bank 0, for instance, signals ZRAL0 and RADE0 are provided from control circuit 22. Signals are provided to other banks 1 to 3 in the similar manner.

Thus, the same effects as those produced by the second embodiment can be obtained, while the reduction in circuit area can be achieved in a semiconductor memory device having a multi-bank arrangement (for instance, of four banks).

In addition, although the redundancy replacement is described in relation to a redundant row above, a replacement with a redundant column can also be effected where a column predecoder and a column decoder instead of a row predecoder and a row decoder are used and a redundant column select line corresponding to a redundant column is selected instead of a normal column select line corresponding to a normal column.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a control circuit for controlling an operation of said semiconductor memory device;
   a memory cell array including a plurality of memory cells arranged in a matrix of rows and columns,
   said memory cell array including:
      a normal memory cell array including a plurality of normal memory cells; and
      a redundant memory cell array including a plurality of redundant memory cells to replace defective memory cells in said normal memory cell array, said semiconductor memory device further comprising:
   an address buffer for receiving and latching a row address signal and a column address signal provided from outside said semiconductor memory device in response to a control signal from said control circuit; and
   a row select circuit for selecting a row of said memory cell array according to said row address signal,
   said row select circuit including:
      a row predecoder for receiving the row address signal from said address buffer posterior to the latching of the row address signal, to generate a row predecode signal;
      a redundancy determination circuit for holding a defective memory cell address in advance, for receiving the row address signal from said address buffer prior to the latching of the row address signal, and for determining whether to perform replacement by said redundant memory cells;
      a normal row decoder for selecting a memory cell row from said normal memory cell array according to said row predecode signal from said row predecoder when no redundancy replacement is performed; and a redundant row decoder for selecting a memory cell row from said redundant memory cell array when the redundancy replacement is performed, said semiconductor memory device further comprising:

a column select circuit for generating a signal for selecting at least one of columns of said memory cell array according to said column address signal; and a data input/output circuit for communicating storage data with the selected said memory cell column.

2. The semiconductor memory device according to claim 1, further comprising:

an address bus for transmitting said row address signal from said address buffer to said redundancy determination circuit prior to the latching of the row address signal; and a predecode line group for transmitting said row predecode signal from said row predecoder to said row decoder.

3. The semiconductor memory device according to claim 2, wherein said redundant row decoder selects a memory cell row from said redundant memory cell array according to said row predecode signal from said row predecoder when a redundancy replacement is performed.

4. The semiconductor memory device according to claim 1, wherein said normal memory cell array is divided into a plurality of normal memory cell blocks, said redundant memory cell array is divided into a plurality of redundant memory cell blocks respectively corresponding to said normal memory cell blocks, said redundancy determination circuit includes a plurality of local redundancy determination circuits respectively provided to said plurality of normal memory cell blocks, said normal row decoder includes a plurality of local normal row decoder circuits respectively provided to said plurality of normal memory cell blocks, said redundant row decoder includes a plurality of local redundant row decoder circuits respectively provided to said plurality of redundant memory cell blocks, said semiconductor memory device further comprising:

an address bus provided in common to said plurality of local redundancy determination circuits for transmitting said row address signal from said address buffer to said plurality of local redundancy determination circuits prior to the latching of the row address signal; and a predecode line group provided in common to said plurality of local normal row decoder circuits for transmitting said row predecode signal from said row predecoder to said plurality of local normal row decoder circuits.

5. The semiconductor memory device according to claim 4, wherein said redundant row decoder selects a memory cell row from said redundant memory cell array according to said row predecode signal from said row predecoder when a redundancy replacement is performed.

6. The semiconductor memory device according to claim 4, wherein said plurality of normal memory cell blocks are independently accessible banks.

7. The semiconductor memory device according to claim 6, wherein said redundancy determination circuit further includes a defective address comparing portion provided in common to said plurality of local redundancy determination circuits for holding said defective memory cell address in advance and for comparing said row address signal from said address buffer with said defective memory cell address prior to the latching of the row address signal, and wherein each of said local redundancy determination circuits includes a plurality of redundancy determination signal generating circuits for generating signals for controlling said local normal row decoder circuits and said local redundant row decoder circuits of a corresponding bank according to a comparison result of said defective address comparing portion.

8. A semiconductor memory device, comprising:

a control circuit for controlling an operation of said semiconductor memory device;

a memory cell array including a plurality of memory cells arranged in a matrix of rows and columns, said memory cell array including:

a normal memory cell array including a plurality of normal memory cells; and a redundant memory cell array including a plurality of redundant memory cells to replace defective memory cells in said normal memory cell array, said semiconductor memory device further comprising:

an address buffer for receiving and latching a row address signal and a column address signal provided from outside said semiconductor memory device in response to a control signal from said control circuit, said address buffer including a predecode latch circuit for generating a row predecode signal from said row address signal; and a row select circuit for selecting a row of said memory cell array according to said row address signal, said row select circuit including:

a redundancy determination circuit for holding a defective memory cell address in advance, for receiving the row address signal prior to the latching of the row address signal, and for determining whether to perform replacement by said redundant memory cells;

a normal row decoder for selecting a memory cell row from said normal memory cell array according to said row predecode signal from said predecode latch circuit when no redundancy replacement is performed; and a redundant row decoder for selecting a memory cell row from said redundant memory cell array when the redundancy replacement is performed, said semiconductor memory device further comprising:

a column select circuit for generating a signal for selecting at least one of columns of said memory cell array according to said column address signal; and a data input/output circuit for communicating storage data with a selected said memory cell column.

9. The semiconductor memory device according to claim 8, further comprising:

an address bus for transmitting said row address signal from said address buffer to said redundancy determination circuit prior to the latching of the row address signal; and a predecode line group for transmitting said row predecode signal from said row predecoder to said row decoder.

10. The semiconductor memory device according to claim 9, wherein
said redundant row decoder selects a memory cell row from said redundant memory cell array according to said row predecode signal from said row predecoder when a redundancy replacement is performed.

11. The semiconductor memory device according to claim 8, wherein
said normal memory cell array is divided into a plurality of normal memory cell blocks,
said redundant memory cell array is divided into a plurality of redundant memory cell blocks respectively corresponding to said normal memory cell blocks,
said redundancy determination circuit includes a plurality of local redundancy determination circuits respectively provided to said plurality of normal memory cell blocks,
said normal row decoder includes a plurality of local normal row decoder circuits respectively provided to said plurality of normal memory cell blocks,
said redundant row decoder includes a plurality of local redundant row decoder circuits respectively provided to said plurality of redundant memory cell blocks, said semiconductor memory device further comprising:
an address bus provided in common to said plurality of local redundancy determination circuits for transmitting said row address signal from said address buffer to said plurality of local redundancy determination circuits prior to the latching of the row address signal; and
a predecode line group provided in common to said plurality of local normal row decoder circuits for transmitting said row predecode signal from said predecode latch circuit to said plurality of local normal row decoder circuits.

12. The semiconductor memory device according to claim 11, wherein
said redundant row decoder selects a memory cell row from said redundant memory cell array according to said row predecode signal from said row predecoder when a redundancy replacement is performed.

13. The semiconductor memory device according to claim 11, wherein
said plurality of normal memory cell blocks are independently accessible banks.

14. The semiconductor memory device according to claim 13, wherein
said predecode latch circuit includes:
a predecode portion provided in common to said plurality of banks for generating said row predecode signals from said row address signal; and
a plurality of latch circuits, each provided corresponding to each said banks for receiving and holding outputs from said predecode portion and for outputting said predecode signal to said local normal row decoder circuit of a corresponding bank.

* * * * *